(12) United States Patent
Kong et al.

(10) Patent No.: US 7,518,572 B2
(45) Date of Patent: Apr. 14, 2009

(54) APPARATUS OF DRIVING PLASMA DISPLAY PANEL

(75) Inventors: Junc Hee Kong, Busan (KR); Ki Duck Park, Kumi-shi (KR)

(73) Assignee: LG Electronics Inc., Seoul (KR)

( * ) Notice: Subject to any disclaimer, the term of this patent is extended or adjusted under 35 U.S.C. 154(b) by 668 days.

(21) Appl. No.: 10/849,875

(22) Filed: May 21, 2004

(65) Prior Publication Data
US 2004/0233133 A1    Nov. 25, 2004

(30) Foreign Application Priority Data
May 23, 2003    (KR)    ...................... 10-2003-0033075

(51) Int. Cl.
G09G 3/28    (2006.01)
G09G 3/36    (2006.01)

(52) U.S. Cl. ........................................ 345/60; 345/101
(58) Field of Classification Search .................... 345/60, 345/101, 106; 313/46; 257/684, 470; 374/178
See application file for complete search history.

(56) References Cited

U.S. PATENT DOCUMENTS

| 5,526,015 | A | * | 6/1996 | Tsuboyama et al. | ............ 345/97 |
| 5,831,374 | A | * | 11/1998 | Morita et al. | .................. 313/46 |
| 6,149,299 | A | * | 11/2000 | Aslan et al. | .................. 374/178 |
| 6,175,396 | B1 | * | 1/2001 | Kim et al. | ...................... 349/58 |
| 6,442,026 | B2 | * | 8/2002 | Yamaoka | ...................... 361/704 |
| 6,703,702 | B2 | * | 3/2004 | Inoue et al. | .................. 257/684 |
| 6,720,940 | B2 | * | 4/2004 | Awamoto et al. | ............. 345/60 |
| 6,774,872 | B1 | * | 8/2004 | Kawada et al. | ................ 345/60 |
| 6,774,883 | B1 | * | 8/2004 | Muhlemann | ................ 345/101 |

FOREIGN PATENT DOCUMENTS

| JP | 09-198005 | 7/1997 |
| KR | 10-2003-0028024 | * 5/2003 |

* cited by examiner

*Primary Examiner*—Kevin M Nguyen
(74) *Attorney, Agent, or Firm*—Ked & Associates, LLP

(57) ABSTRACT

A temperature of the plasma display panel is detected by a temperature sensor. An apparatus includes a display panel, a plate disposed adjacent to a rear surface of the panel, and a board disposed substantially parallel to the plate. A temperature sensor is formed on the board, and the temperature sensor is disposed between the plate and the board.

19 Claims, 9 Drawing Sheets

APPARATUS OF DRIVING PLASMA DISPLAY PANEL

This application claims the benefit of Korean Patent Application No. P2003-33075 filed in Korea on May 23, 2003, which is hereby incorporated by reference.

BACKGROUND OF THE INVENTION

1. Field of the Invention

The present invention relates to a plasma display panel, and more particularly, to an apparatus of driving a plasma display panel capable of accurately detecting a temperature of the plasma display panel for a stable driving of the plasma display panel.

2. Description of the Related Art

Recently, various flat panel devices have been developed that reduce weight and bulk, which are drawbacks of the cathode ray tube (CRT). Such flat panel display devices include a liquid crystal display (LCD) device, a field emission display (FED) device, a plasma display panel (PDP), an electro-luminescence display (ELD) device, and the like.

The PDP of these flat panel display devices displays pictures by using a plasma discharge. The PDP has been used for high-resolution televisions, monitors and internal or external advertising display devices because it has a rapid response speed and is suitable for displaying a large-area picture.

Figure 1:
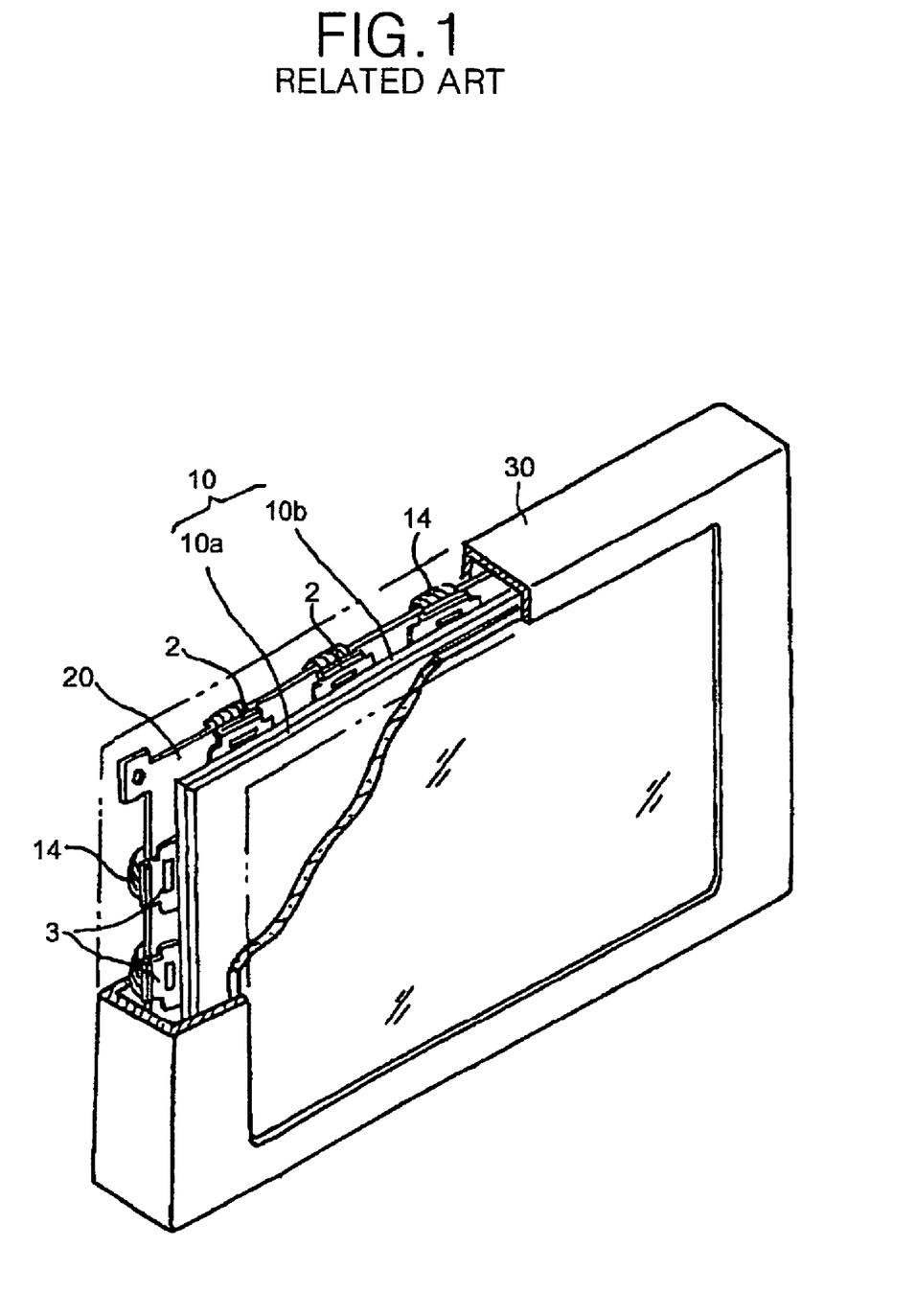
FIG. 1 is a perspective view illustrating a related art plasma display panel.
Figure 2:
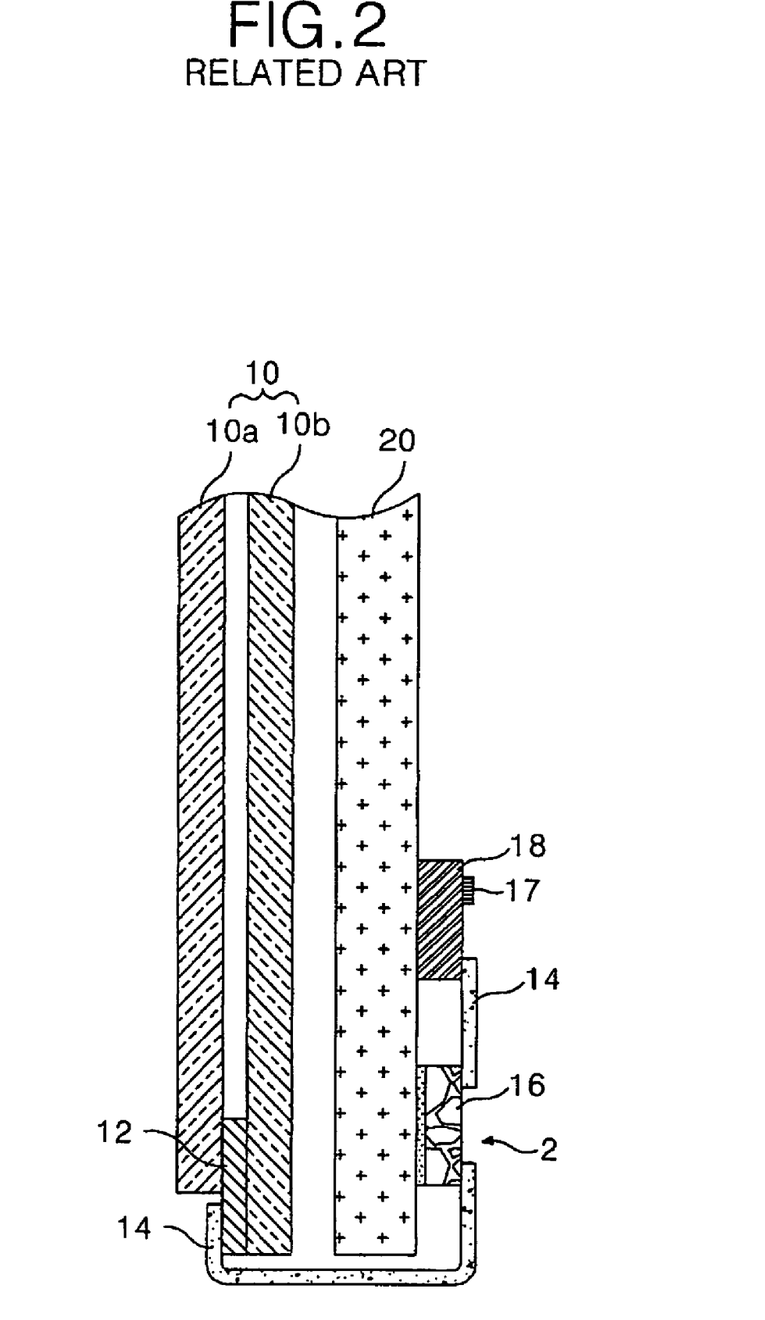
FIG. 2 is a sectional view illustrating a plasma display panel shown in FIG. 1.

Referring to FIGS. 1 and 2, a related art PDP includes a panel 10, a printed circuit board (PCB) 18 for driving the panel 10 and a heat-proof plate 20 attached to a rear surface of the panel 10.

The panel 10 includes: an upper substrate 10a having a plurality of scan electrodes and a plurality of sustain electrodes; and a lower substrate 10b having a plurality of address electrodes formed in a direction crossing the scan electrodes and the sustain electrodes, and a phosphorous material layer formed on an entire surface of the substrate. A phosphorous material generates a visible ray by a discharge between the scan electrodes and the sustain electrodes, and the address electrodes, and adjusts a transmittance of the visible ray to display a designated picture.

The heat-proof plate 20 supports the panel 10 and serves to radiate a heat generated upon driving of the panel 10. The heat-proof plate 20 is made of a metal material with a good thermal conductivity, for example, aluminum (Al), for making a radiation well.

The panel 10 requires a plurality of driver integrated circuits (ICs), connected to the scan electrodes and the address electrodes, for supplying a data signal and a scanning signal. The driver ICs include a scan driver IC 3 and a data driver IC 2. Each of the driver ICs is installed between the PCB 18 and the panel 10, and supplies a driving signal to the panel 10 in response to a control signal supplied from the PCB 18. To this end, the PCB 18 and the panel 10 are connected to each other by mean of a flexible printed circuit (FPC) 14. If the driver ICs are packaged by way of a chip on film (COF) system, one side of the FPC 14 is connected to an IC chip 16 of the scan and the data drivers 3 and 2, and other side of the FPC 14 is connected to pads 12 connected to driving electrodes of the panel 10.

A case 30 is installed to protect the PDP from an external impact when the PDP is produced.

Such a PDP is driven by a time-divisional scheme in which one frame is divided into various sub-fields having a different emission frequency, so as to realize gray levels of a picture. Each sub-field is again divided into an initialization period for initializing the entire field, an address period for selecting a scan line and selecting the cell from the selected scan line and a sustain period for expressing gray levels depending on the discharge frequency.

Figure 3:
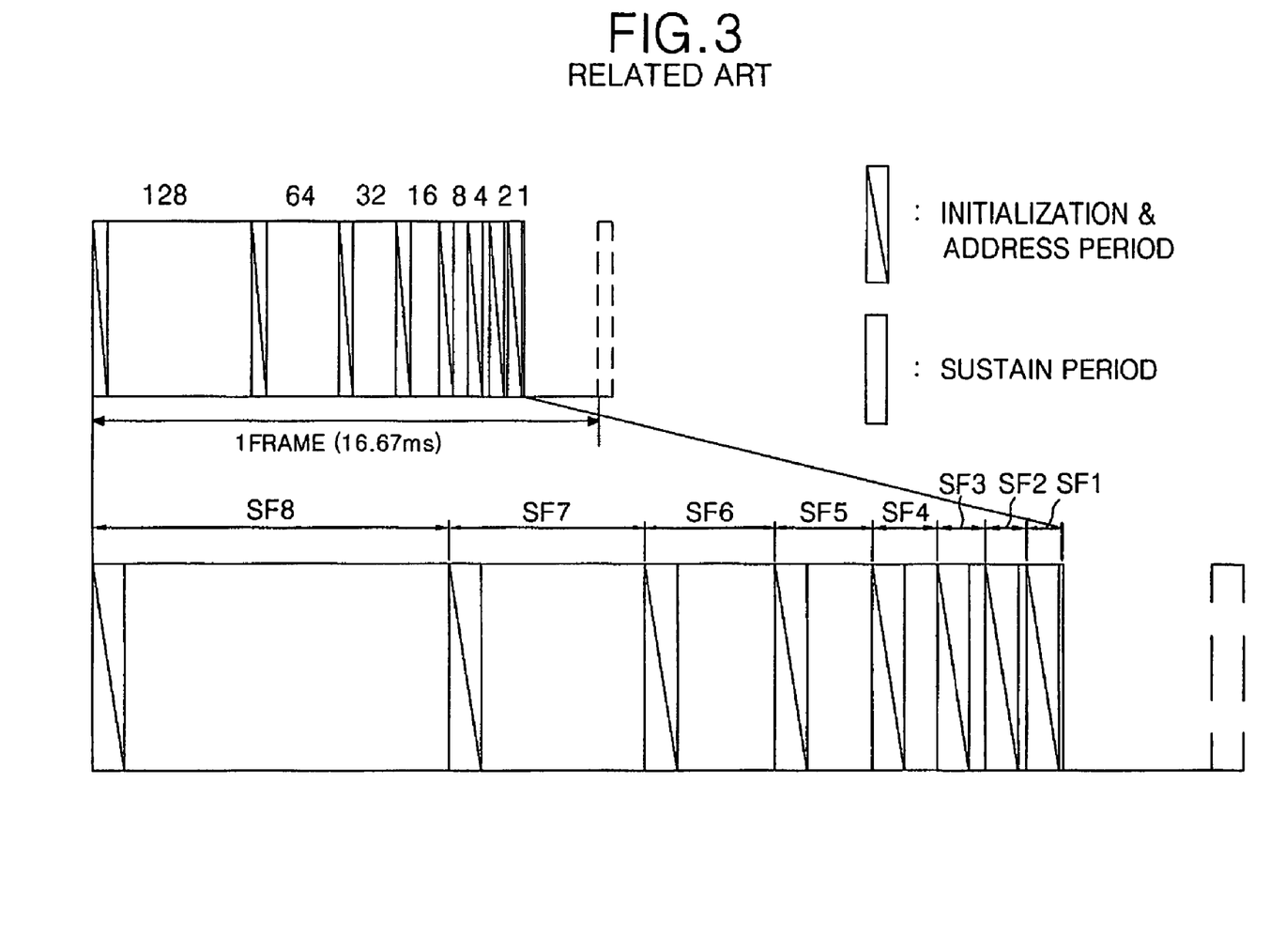
FIG. 3 is a configuration representing a frame constitution of 8-bit default code for realizing 256 gray levels.

Herein, the initialization period is again divided into a set-up interval during which a rising ramp waveform is supplied and a set-down interval during which a falling ramp waveform is supplied. For instance, when it is intended to display a picture of 256 gray levels, a frame interval equal to $\frac{1}{60}$ second (i.e. 16.67 msec) is divided into 8 sub-fields SF1 to SF8 as shown in FIG. 2. Each of the 8 sub-field SF1 to SF8 is divided into the initialization period, the address period and the sustain period as mentioned above. Herein, the initialization period and the address period of each sub-field are equal for each sub-field, whereas the sustain period and the number of sustain pulses assigned thereto are increased at a ratio of $2^n$ (where n=0, 1, 2, 3, 4, 5, 6 and 7) at each sub-field.

Figure 4:
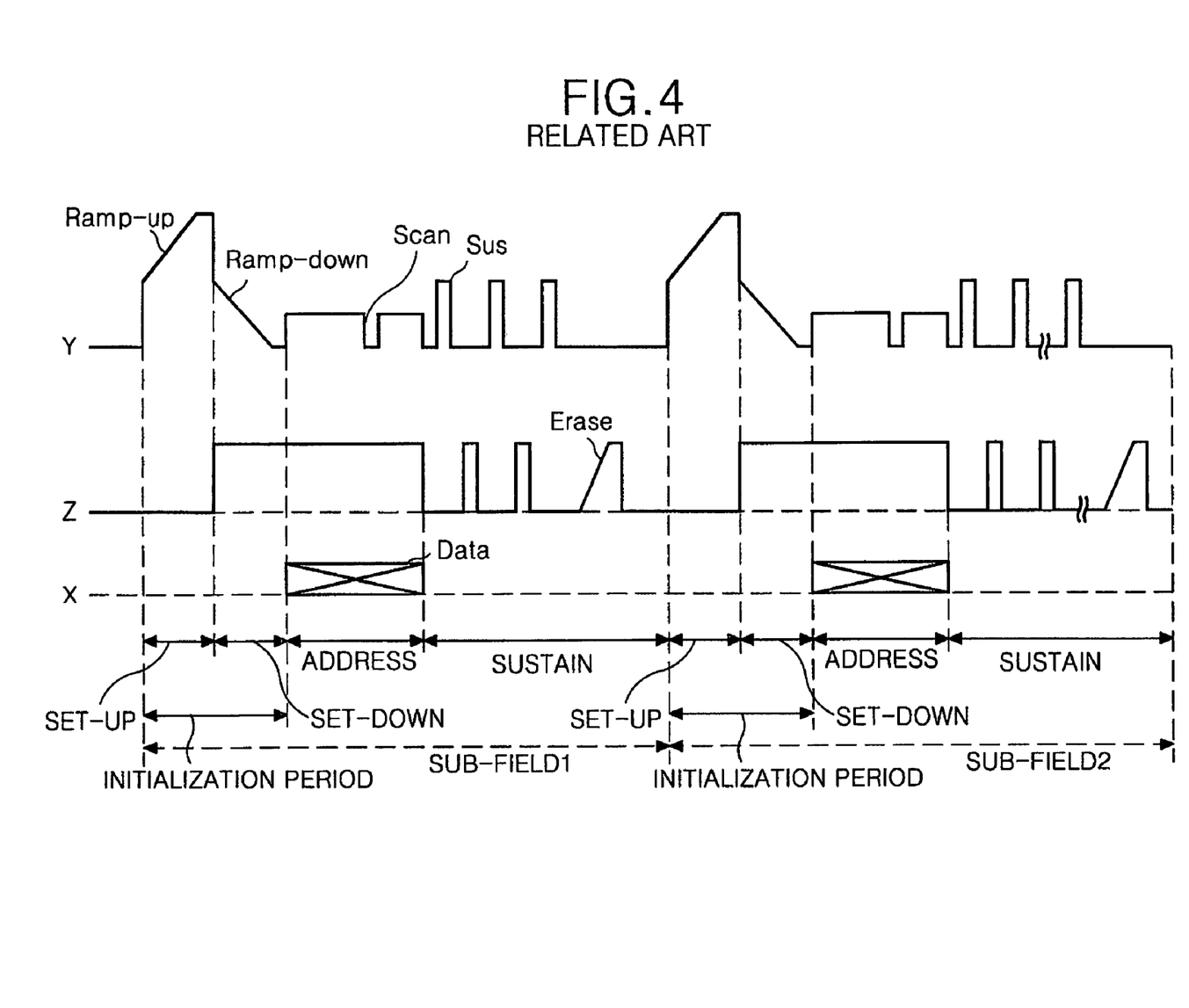
FIG. 4 is a waveform diagram representing a driving method of a plasma display panel according to the related art.

FIG. 4 shows a driving waveform of the PDP applied to two sub-fields.

In FIG. 4, Y represents the scan electrode, Z represents the sustain electrode, and X represents the address electrode.

Referring to FIG. 4, the PDP is divided into an initialization period for initializing the full field, an address period for selecting a cell, and a sustain period for sustaining a discharge of the selected cell for its driving.

In the initialization period, a rising ramp waveform Ramp-up is simultaneously applied to all of the scan electrodes Y in a set-up interval. This rising ramp waveform Ramp-up causes a weak discharge within cells of the full field to generate wall charges within the cells. In the set-down interval, after the rising ramp waveform Ramp-up was supplied, a falling ramp waveform Ramp-down falling from a positive voltage lower than a peak voltage of the rising ramp waveform Ramp-up is simultaneously applied to the scan electrodes Y. The falling ramp waveform Ramp-down causes a weak erasure discharge within the cells, to thereby erase spurious charges of wall charges and space charges generated by the set-up discharge and uniformly leave wall charges required for the address discharge within the cells of the full field.

In the address period, a negative scanning pulse Scan is sequentially applied to the scan electrodes Y, and, at the same time, a positive data pulse Data is applied to the address electrodes X. A voltage difference between the scanning pulse Scan and the data pulse Data is added to a wall voltage generated in the initialization period to thereby generate an address discharge within the cells to which the data pulse Data is supplied. Wall charges are formed within the cells selected by the address discharge.

Meanwhile, a positive direct current voltage having a sustain voltage level Vs is applied to the sustain electrodes Z during the set-down interval and the address period.

In the sustain period, a sustaining pulse Sus is alternately applied to the scan electrodes Y and the sustain electrodes Z. Then, a wall voltage within the cell selected by the address discharge is added to the sustain pulse Sus to thereby generate a sustain discharge taking a surface-discharge type between the scan electrode Y and the common sustain electrode Z whenever each sustain pulse Sus is applied. Finally, after the sustain discharge has been finished, an erasing ramp waveform Erase having a small pulse width is applied to the sustain electrode Z to thereby erase wall charges left within the cells.

However, if the related art PDP is operated at a low temperature, then a brightness point erroneous fire occurs. In other words, as the result of an operation characteristic at a low-temperature, the PDP in accordance with the operation temperature causes the brightness point erroneous fire at a plurality of discharge cells. It has been supposed that such a brightness point erroneous fire occurs because a motion of particles becomes dull at the low temperature.

More specifically, if a motion of particles becomes dull at a low temperature, then an erasure discharge caused by the erasing ramp waveform Erase may be not normally generated. Wall charges formed in the scan electrode Y and the sustain electrode Z are not erased from cells in which such an erasure discharge has not been normally generated.

Thereafter, in the set-up interval, a positive rising ramp waveform Ramp-up is applied to the scan electrode Y. At this time, since negative wall charges has been formed at the scan electrode Y, that is, since the polarity of a voltage applied to the scan electrode Y is contrary to that of wall charges formed in the scan electrode Y, a normal discharge is not generated in the set-up interval. Thus, a normal discharge is not generated in the set-down interval following the set-up interval. As described above, if the normal discharge does not occur in the initialization period, then wall charges excessively formed in the erasure period make an affect to the address period and the sustain period. In other words, a strong discharge entailing an undesired shape of brightness point is generated in the sustain period due to the wall charges formed excessively in the discharge cells. Thus, in order to prevent the brightness point erroneous fire at the low temperature, the PDP detects a peripheral temperature by a temperature sensor 17 installed in the PCB 18 as shown in FIG. 2 to apply a driving waveform for a driver to suit with a temperature of the driver, to thereby make to display.

However, since a voltage property and a waveform property of a module according to the peripheral surrounding are different, all of the driving properties of a panel can be adjusted in accordance with a temperature, but a reference surrounding temperature and an actual temperature of the panel have a lot of difference. That is, since the temperature sensor 17 is built in the PCB 18 and detects the temperature of the panel 10, it is impossible to detect an accurate temperature and it is difficult to compensate an error caused by the temperature.

SUMMARY OF THE INVENTION

Accordingly, it is an object of the present invention to provide an apparatus of driving a plasma display panel capable of accurately detecting a temperature of the plasma display panel for a stably driving of the plasma display panel.

In order to achieve these and other objects of the invention, an apparatus of driving a plasma display panel according to an embodiment of the present invention includes: a display panel; a heat-proof plate attached on a rear surface of the panel; a heat carrying sheet, attached on a rear surface of the heat-proof plate, for carrying a temperature of the panel; and a temperature sensor, installed in a substrate, for detecting a temperature of the heat carrying sheet.

The apparatus further includes; a polarity of protrusions, installed on the rear of the heat-proof plate, for fixing the heat-proof plate to the substrate; and a double-sided tape, attached on the rear of the heat-proof plate, for attaching the protrusions to the heat-proof plate.

The apparatus further includes a molding product formed between the protrusions and the double-sided tape.

In the apparatus, the molding product uniformly keeps a gap between the heat-proof plate and the substrate.

In the apparatus, the heat carrying sheet is formed as an insulator and includes a resin, having a heat transfer coefficient more than approximately 1.5 W/mk.

The apparatus further includes: a driving circuit part for driving the panel; and a controller for controlling the driving circuit part.

In the apparatus, the controller supplies a control signal depending on the temperature of the panel detected from the substrate to the driving circuit part.

In the apparatus, the driving circuit part supplies a driving waveform depending on the control signal supplied from the controller to the panel.

The apparatus further includes a detection circuit, installed on the substrate, for converting an analog temperature signal of the display panel supplied by the temperature sensor into a digital temperature signal.

The apparatus further includes: a plurality of holes, formed on the substrate, in which the protrusions are inserted, respectively; and a connector for supplying an output signal of the detection circuit to the controller.

BRIEF DESCRIPTION OF THE DRAWINGS

These and other objects of the invention will be apparent from the following detailed description of the embodiment of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawing.

Hereinafter, the preferred embodiments of the present invention will be described in detail with reference to FIGS. 5 to 8.

Figure 5:
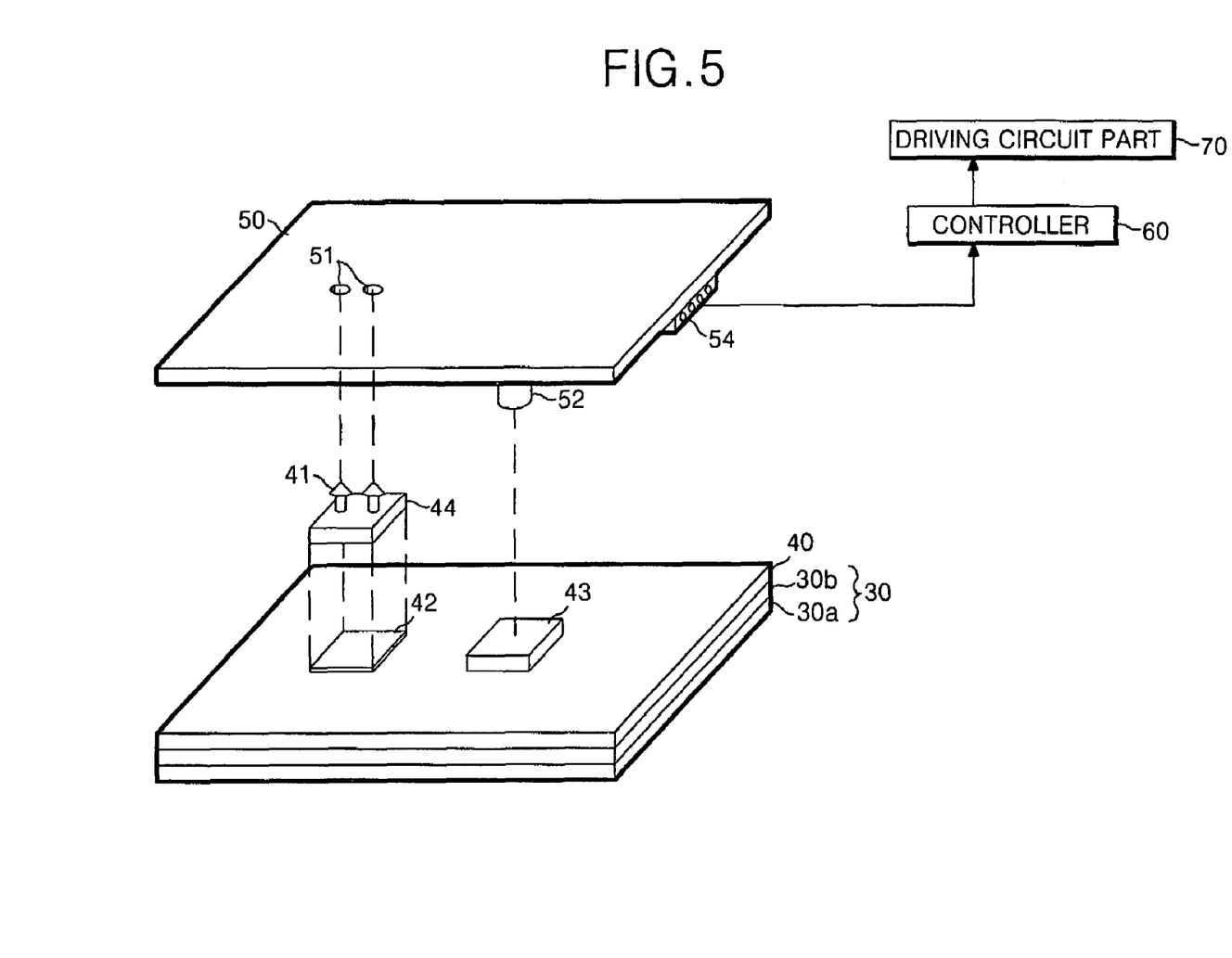
FIG. 5 is a configuration of an apparatus of driving a plasma display panel according to an embodiment of the present invention.
Figure 6:
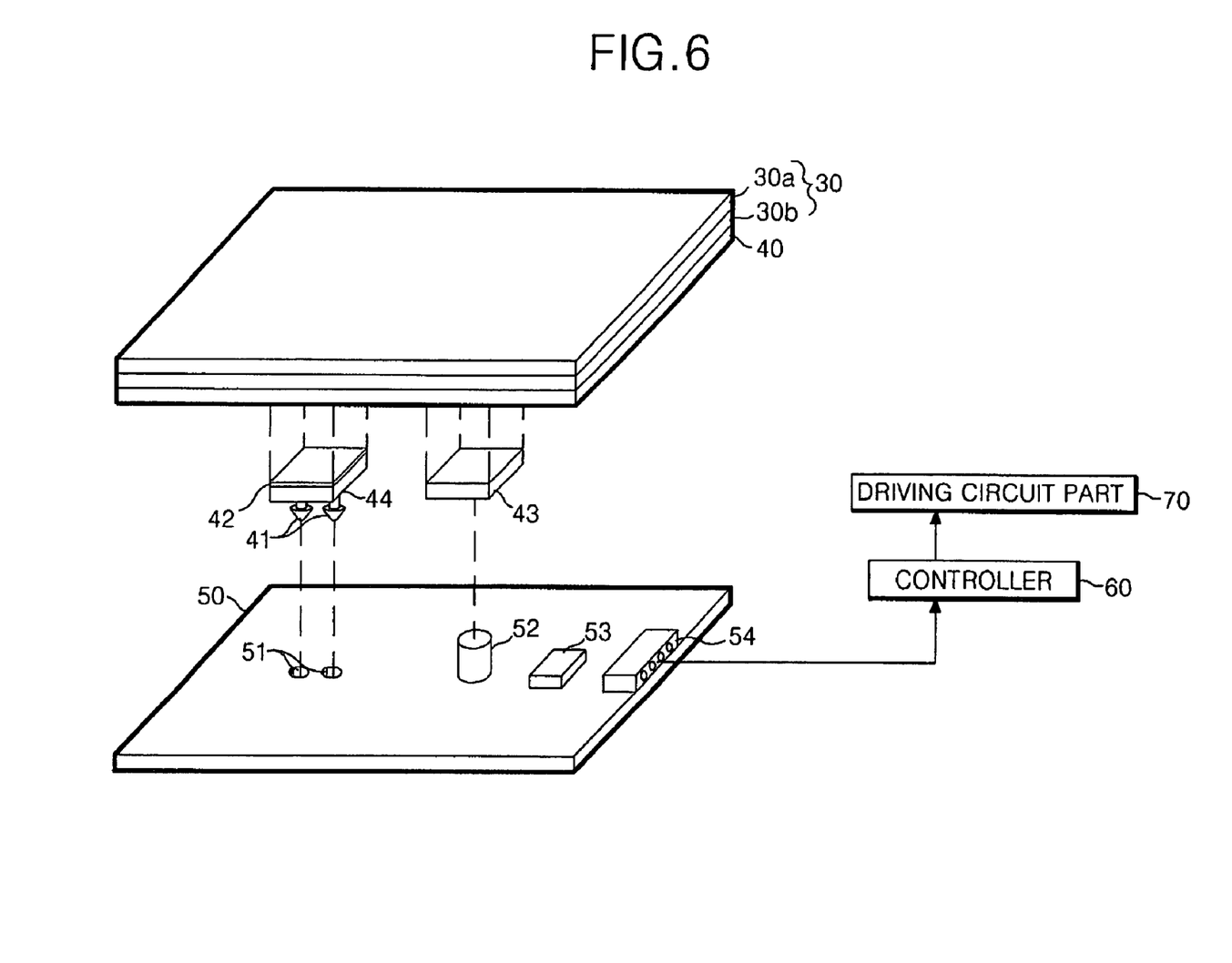
FIG. 6 is a configuration of the plasma display panel shown in FIG. 5 rotated by 180°.

FIG. 5 is a configuration of an apparatus of driving a plasma display panel according to an embodiment of the present invention, and FIG. 6 is a configuration of the plasma display panel shown in FIG. 5 rotated by 180°.

Referring to FIGS. 5 and 6, a PDP according to the present invention includes: a panel 30; a heat-proof plate 40, attached on a rear surface of the panel 30, for dissipating a heat generated upon driving the panel 30; a sensor PCB 50 having a temperature sensor 50 installed thereon for detecting a temperature of the panel 30; a controller 60 for producing different control signals in accordance with the temperature of the panel detected by the sensor PCB 50; and a driving circuit part 70 supplying different driving waveforms to the panel 30 in accordance with the control signals from the controller 60.

The panel 30 includes: an upper substrate 30a having a plurality of scan electrodes and a plurality of sustain electrodes; and a lower substrate 30b having a plurality of address electrodes formed in a direction crossing the scan electrodes and the sustain electrodes, and a phosphorous material layer formed on an entire surface of the substrate. A phosphorous material generates a visible ray by a discharge between the scan electrodes and the sustain electrodes and the address electrodes, and adjusts a transmittance of the visible ray to display a designated picture.

The heat-proof plate 40 supports the panel 30 and serves to radiate a heat generated upon driving of the panel 30. On a rear surface of the heat-proof plate 40, a plurality of protrusions for fixing the heat-proof plate 40 to the sensor PCB 50 as shown in FIG. 5 are installed, and a double-sided tape for attaching the protrusions 41 to the heat-proof plate 40 is attached. Also, when the sensor PCB 50 including the temperature sensor 52 is directly contacted to the rear surface of the heat-proof plate 40, a heat carrying sheet 43 is attached to the heat-proof plate 40 in order to reduce an effect of vibration while effectively detecting a temperature. The heat carrying sheet 43 is contacted with the temperature sensor 52 installed in the sensor PCB 50 to carry the temperature of the panel to the sensor PCB 50. The protrusions 41 is used to fix the sensor PCB 50 including the temperature 52, but if a height of the protrusions 41 is low, a molding product 44 is used to uniformly keep a gap between the sensor PCB 50 and the heat-proof plate 40. The molding product 44 is installed in the heat-proof plate 40 by using the double-sided tape. The heat-proof plate 40 is made of a metal material with a good thermal conductivity, for example, aluminum (Al), for making a radiation well.

Meanwhile, the protrusions 41 have a shape of a mushroom so that they are easily inserted in the sensor PCB 40 and do not easily come out from the sensor PCB 40 when they are inserted once. The heat carrying sheet 43 serves as an insulator in order to efficiently detect a temperature of the panel 30, and includes a resin, having a heat transfer coefficient more than approximately 1.5 W/mk, where, W represents the watt, m represents a thickness, and k represents the Kelvin temperature.

The sensor PCB 50 serves to detect the temperature of the panel. A plurality of holes 51 are formed to insert the protrusions 41 attached on the heat proof plate 40 in the sensor PCB 50 as shown FIG. 6. Also, installed on the rear surface of the sensor PCB 50 are a temperature sensor 52 for detecting a temperature of the panel 30, a detection circuit part 53 for converting the detected temperature in a type of analog into a digital temperature, and a connector 54 for supplying the detected temperature to the controller. Meanwhile, the temperature sensor 52 contacts with the heat carrying sheet 42 attached on the rear surface of the heat-proof plate 40 to detect a temperature of the panel.

The controller 60 receives the temperature of the panel detected by the connector 54 installed in the sensor PCB 50 and then supplies a control signal depending on the temperature of the panel detected by a detection circuit part 53 to the driving circuit part 70. Once again, the control signals from the controller 60 differ from each other in accordance with the detected temperature of the panel.

The driving circuit part 70 supplies a driving waveform depending on the control signal, that is, the detected temperature of the panel 30, supplied from the controller 60 to the panel 30. Once again, the driving waveforms from the driving circuit part 70 differ from each other in accordance with the control signal from the controller 60.

Figure 7A:
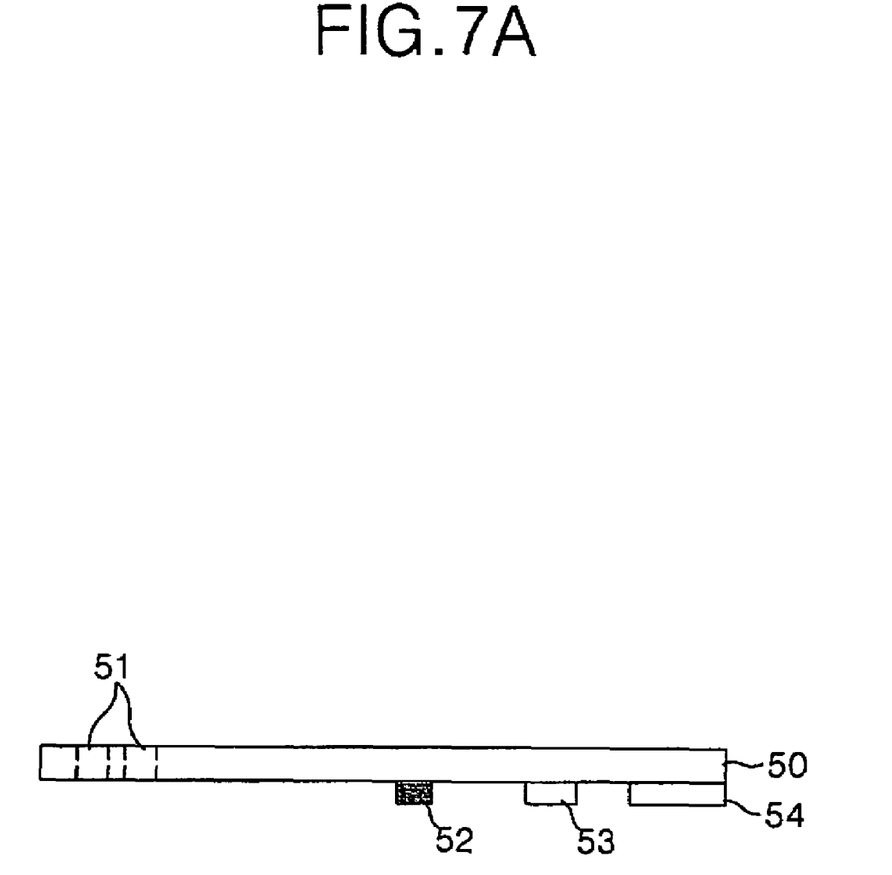
FIG. 7A is a configuration illustrating a sensor PCB shown in FIG. 5.
Figure 7B:
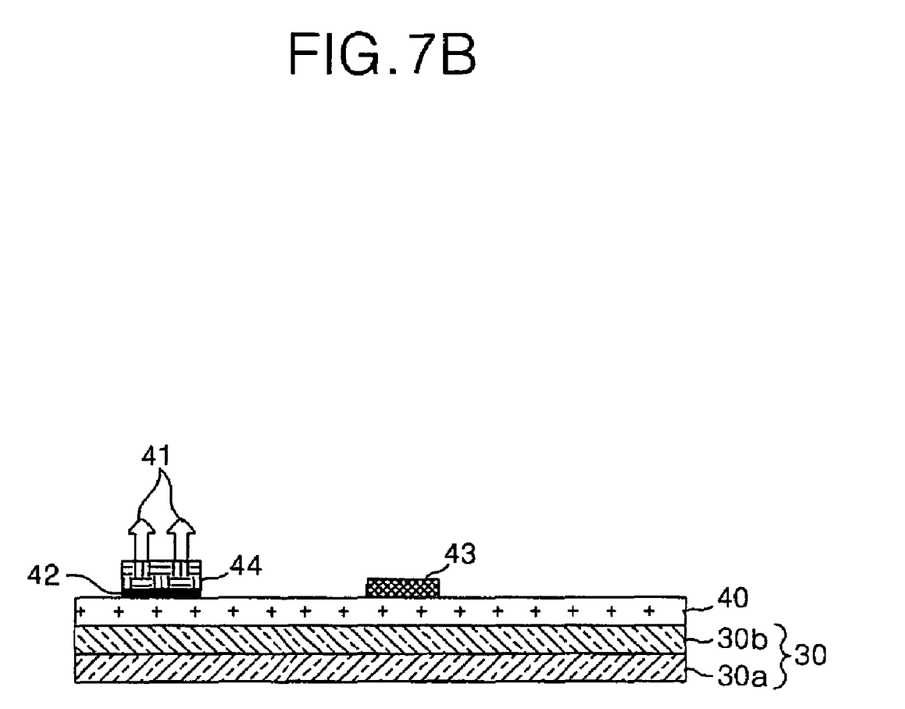
FIG. 7B is a configuration illustrating a heat-proof plate shown in FIG. 5.
Figure 8:
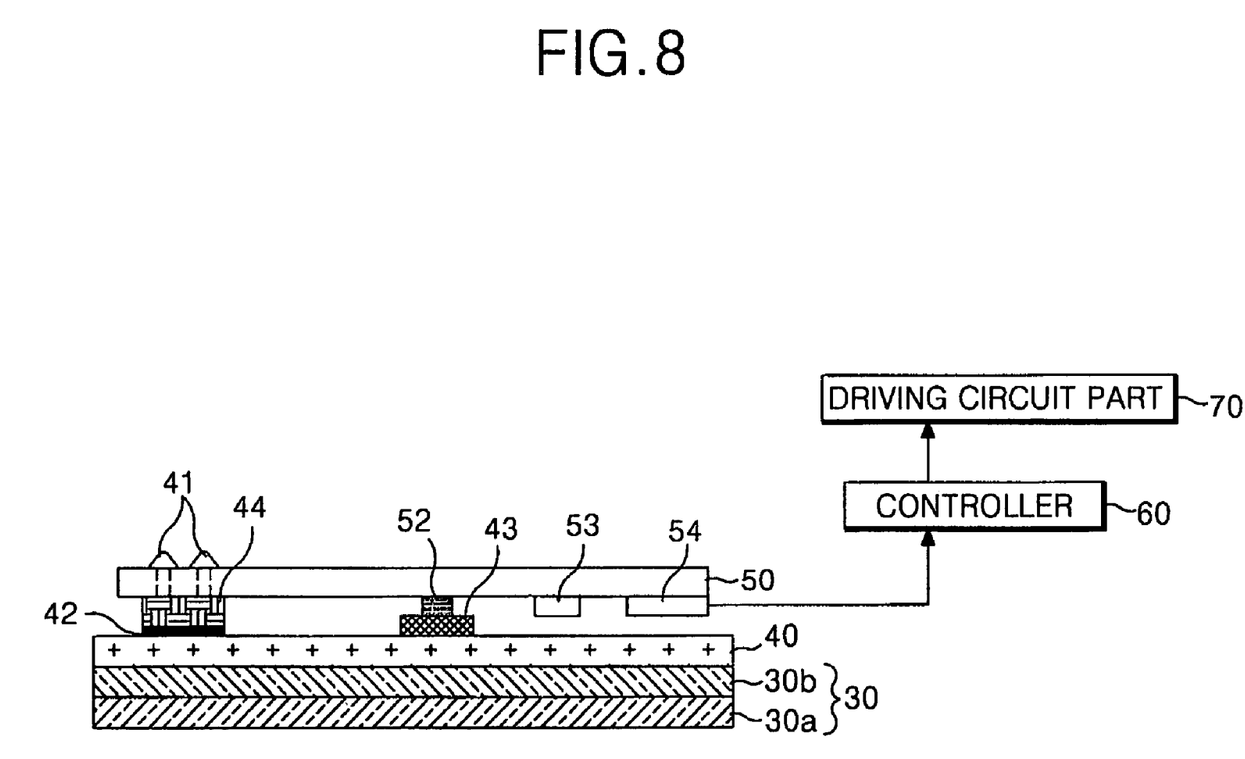
FIG. 8 is a combination of the configurations shown in FIG. 7A and FIG. 7B.

As set forth above, according to the present invention of the apparatus of driving the PDP, the sensor PCB 50 having the temperature sensor 52 as shown in FIG. 7A is directly contacted to the heat-proof plate 40 attached on the rear surface of the panel 30 as shown in FIG. 7B. Accordingly, as shown in FIG. 8, the temperature sensor 52 installed in the sensor PCB 50 is contacted with the heat carrying sheet 43 attached on the heat-proof plate 40. The analog temperature of the panel detected by the temperature sensor 52 is converted into a digital temperature through the detecting circuit part 53 and then the digital temperature is supplied through the connector 54 to the controller 60. The driving circuit part 70 supplies the driving waveforms different from each other depending on the control signals different from each other supplied from the controller 60, that is, the detected temperature of the panel, to the panel 30. Accordingly, it is possible to stably drive by supplying the driving waveforms depending on the detected temperature of the panel 30 to the panel 30.

As described above, the apparatus of driving the PDP according to the present invention is capable of accurately detecting a temperature of a panel by contacting the temperature sensor installed in the sensor PCB with the heat carrying sheet attached on the heat-proof plate in order to reduce an effect of vibration and effectively detect a temperature of a panel. Therefore, it is possible to stably drive by supplying the driving waveforms in accordance with an accurately detected temperature of the panel to the panel.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An apparatus for a display panel, comprising:
   a display panel having a first substrate including a plurality of first electrodes in a first direction and a second substrate having a plurality of second electrodes in a second direction, a plurality of cells provided in areas where the first and second electrodes cross one another, wherein the first and second substrate are attached to each other such that a surface of the first substrate is a front surface of the display panel and a surface of the second substrate is a rear surface of the display panel;
   a plate provided on the rear surface of the display panel, the plate being made from a heat conductive material;
   a non-flexible printed circuit board of a first prescribed shape and having a temperature sensor and a connector, wherein a gap is provided between the plate and the printed circuit board, and the temperature sensor is provided in the gap; and
   a controller to control an operation of the display panel, the controller receives at least one signal indicative of a temperature detected by the temperature sensor via the connector and at least one signal line, and the controller is provided separately from the non-flexible printed circuit board on which the temperature sensor is provided.

2. The apparatus of claim 1, wherein the plurality of first electrodes of the first substrate comprises a plurality of scan and sustain electrodes, and the plurality of second electrodes are address electrodes.

3. The apparatus of claim 1, wherein the plate is made of aluminum.

4. The apparatus of claim 1, wherein the gap is provided by a gap forming member of a second prescribed shape and thickness, the gap forming member being provided on the plate and supporting the non-flexible printed circuit board.

5. The apparatus of claim 4, wherein the size of the second prescribed shape is smaller than a size of the first prescribed shape.

6. The apparatus of claim 4, wherein the gap forming member comprises a molded product for fixing the non-flexible printed circuit board to the plate.

7. The apparatus of claim 6, wherein the molded product is attached to the plate by a tape, and the molded product has at least one protrusion for fixing the molded product to the non-flexible printed circuit board.

8. The apparatus of claim 7, wherein the non-flexible printed circuit board has at least one hole to receive the at least one protrusion.

9. The apparatus of claim 1, further comprising a heat carrying sheet provided between the plate and the temperature sensor.

10. The apparatus of claim 9, wherein the heat carrying sheet is attached to plate.

11. The apparatus of claim 10, wherein the heat carrying sheet is attached to the temperature sensor.

12. The apparatus of claim 9, wherein the heat carrying sheet has a heat transfer coefficient of at least 1.5 W/mk, where W is watts, m is a thickness, and k is temperature in Kelvin.

13. The apparatus of claim 9, wherein the heat carrying sheet is made of an insulator.

14. The apparatus of claim 13, wherein the insulator includes a resin.

15. The apparatus of claim 1, further comprising a driving circuit coupled to the controller, the driving circuit is provided separately from the non-flexible printed circuit board.

16. The apparatus of claim 15, wherein the non-flexible printed circuit board further includes a detector circuit, the detector circuit receiving a from signal from the temperature detector, and providing a second signal to be received by the controller.

17. The apparatus of claim 16, wherein the first signal is an analog signal, and the second signal is a digital signal.

18. The apparatus of claim 15, wherein the controller provides at least one control signal to the driving circuit based on at least one signal received from the non-flexible printed circuit board, the at least one signal providing information in regard to a temperature of the display panel, wherein the driving circuit adjusts at least one driving signal for the display panel based on the control signal.

19. The apparatus of claim 1, wherein the temperature detected by the temperature sensor is substantially indicative of a temperature of the display panel.

* * * * *